(12) United States Patent
Tsai et al.

(10) Patent No.: US 7,477,515 B2
(45) Date of Patent: Jan. 13, 2009

(54) ELECTRONIC APPARATUS AND THERMAL DISSIPATING MODULE THEREOF

(75) Inventors: Kuo-Ying Tsai, Taipei (TW); Shih-Chang Ku, Taipei (TW)

(73) Assignee: VIA Technologies, Inc., Taipei (TW)

( * ) Notice: Subject to any disclaimer, the term of this patent is extended or adjusted under 35 U.S.C. 154(b) by 329 days.

(21) Appl. No.: 11/407,094

(22) Filed: Apr. 20, 2006

(65) Prior Publication Data
US 2007/0058347 A1 Mar. 15, 2007

(30) Foreign Application Priority Data
Sep. 15, 2005 (TW) .............. 94131921 A

(51) Int. Cl.
*H05K 7/20* (2006.01)

(52) U.S. Cl. .............. 361/700; 361/702; 361/703; 361/710; 361/718

(58) Field of Classification Search .......... 361/703, 361/700, 702, 710, 718
See application file for complete search history.

(56) References Cited

U.S. PATENT DOCUMENTS

| | | | | |
|---|---|---|---|---|
| 4,275,510 A | * | 6/1981 | George | 34/90 |
| 5,339,214 A | * | 8/1994 | Nelson | 361/695 |
| 5,549,155 A | * | 8/1996 | Meyer et al. | 165/104.33 |
| 5,725,050 A | * | 3/1998 | Meyer et al. | 165/104.33 |
| 5,764,482 A | * | 6/1998 | Meyer et al. | 361/699 |
| 5,796,581 A | * | 8/1998 | Mok | 361/687 |
| 5,822,187 A | * | 10/1998 | Garner et al. | 361/687 |
| 5,826,645 A | * | 10/1998 | Meyer et al. | 165/104.33 |
| 5,832,987 A | * | 11/1998 | Lowry et al. | 165/86 |
| 5,966,286 A | * | 10/1999 | O'Connor et al. | 361/699 |
| 6,069,791 A | * | 5/2000 | Goto et al. | 361/687 |
| 6,078,499 A | * | 6/2000 | Mok | 361/687 |
| 6,097,596 A | * | 8/2000 | Cipolla et al. | 361/687 |
| 6,125,035 A | * | 9/2000 | Hood et al. | 361/687 |
| 6,229,704 B1 | * | 5/2001 | Hoss et al. | 361/704 |
| 6,779,595 B1 | * | 8/2004 | Chiang | 165/104.33 |
| 2002/0053421 A1 | * | 5/2002 | Hisano et al. | 165/104.33 |
| 2002/0064027 A1 | * | 5/2002 | Sasaki et al. | 361/700 |
| 2004/0201963 A1 | * | 10/2004 | Garner | 361/700 |
| 2005/0103473 A1 | * | 5/2005 | Todd et al. | 165/104.11 |
| 2005/0133199 A1 | * | 6/2005 | Lo | 165/80.3 |
| 2005/0135063 A1 | * | 6/2005 | Heesen | 361/700 |
| 2005/0265000 A1 | * | 12/2005 | He | 361/709 |
| 2006/0171113 A1 | * | 8/2006 | Wu | 361/687 |

FOREIGN PATENT DOCUMENTS

| | | | | |
|---|---|---|---|---|
| DE | 10145311 A1 | * | 5/2002 | |
| EP | 932330 A1 | * | 7/1999 | |
| GB | 2293446 A | * | 3/1996 | |
| JP | 61006586 A | * | 1/1986 | |
| JP | 62042550 A | * | 2/1987 | |
| JP | 09191440 A | * | 7/1997 | |
| JP | 2002286380 A | * | 10/2002 | |
| JP | 2005251622 A | * | 9/2005 | |

* cited by examiner

*Primary Examiner*—Anatoly Vortman
(74) *Attorney, Agent, or Firm*—Birch, Stewart, Kolasch & Birch, LLP

(57) ABSTRACT

A thermal dissipating module comprises a heat pipe with a first end and a second end, a first joint component connected to the first end, a second joint component connected to the second end, a first thermal conductive plate, and a second thermal conductive plate. It also can be used in an electronic apparatus with a thermal dissipating module.

19 Claims, 11 Drawing Sheets

ELECTRONIC APPARATUS AND THERMAL DISSIPATING MODULE THEREOF

CROSS-REFERENCE TO RELATED APPLICATION

This application claims the priority benefit of Taiwan application Ser. No. 94131921, filed Sep. 15, 2005.

BACKGROUND OF THE INVENTION

1. Field of Invention

The present invention relates to a thermal dissipating module of an electronic apparatus, more particularly to an adjustable thermal dissipating module in view of the locations of thermal emitting and thermal dissipating surfaces.

2. Related Art

Currently, the development of electronic apparatus tends to being light, thin, short and small. While the dimension of the electronic apparatus is gradually shrinking, the thermal dissipating capability is much more concerned. Thus, the conventional thermal dissipating module with fin-type heat sinks and fans is gradually replaced by the thermal dissipating apparatus with thermal pipes.

In FIG. 1a, it is a heat pipe 10 of a conventional thermal dissipating module 1. The heat pipe 10 has a first end 11 and a second end 12. The first end 11 is disposed on a first thermal conductive plate 13, and the first thermal conductive plate 13 is disposed on a thermal emitting electronic device 14, such as a central processing unit (CPU) chip. The second end 12 is disposed on a second thermal conductive plate 15, and the second thermal conductive plate 15 is disposed on a thermal dissipating device 16. By soldering or adhering method, the first end 11 of the heat pipe 10 connects with the first thermal conductive plate 13, and the second end 12 of the heat pipe 10 connects with the second thermal conductive plate 15. Thus, due to the connection between the first end 11 of the heat pipe 10 and the first thermal conductive plate 13, the heat generated from the electronic device 14 can be transferred to the second end 12 of the heat pipe 10. Then, the heat can be dissipated in the thermal dissipating device 16 through the second thermal conductive plate 15. Hence, the function of the thermal dissipation can be reached.

The cross-sectional shapes of the first end 11 and the second end 12 are originally a circular shape. When the first end 11 and second end 12 of the heat pipe 10 are disposed respectively on the first thermal conductive plate 13 and second thermal conductive plate 15 during the assembling process, as shown in FIG. 1b, the cross-sectional shapes of the first end 11 and the second end 12 are deformed into an elliptical shape for easily fixed by a material 17, such as a solder material or an adhesive. However, the change of the cross-sectional shape of the heat pipe 10 may, therefore, ruin the capillary structure of the heat pipe 10. Consequently, the thermal dissipating efficiency of the heat pipe 10 is far below what is expected.

Besides, the conventional structure of the heat pipe 10 is closely jointed to the first thermal conductive plate 13 and second thermal conductive plate 15 by soldering or adhering methods. However, it is really inconvenient and troublesome to disassemble the heat pipe 10 and other devices for replacement.

As a thermal dissipating module of an electronic apparatus is designed, the most proper deployment of the thermal dissipating module for the electronic apparatus is designed for different factors, such as the location of the thermal emitting device, the location of the thermal dissipating device, the inner space layout, and the thermal dissipating device layout, which are required for the electronic apparatus. However, the conventional thermal dissipating module deployment cannot provide flexible adjustments for different electronic apparatus. Hence, it is very costly to develop the conventional thermal dissipating module for various electronic apparatuses.

Therefore, the present invention provides an electronic apparatus and its thermal dissipating module. The structure and assembly are simple in the present invention such that the present invention can provide flexible adjustments in accordance with the case shape and inner deployment of electronic apparatus. Thus, the present invention can be applied to any kinds of structure.

SUMMARY OF THE INVENTION

According to one embodiment of the present invention, a thermal dissipating module comprises a heat pipe with a first end and a second end, a first joint component connected to the first end, a second joint component connected to the second end, a first thermal conductive plate, and a second thermal conductive plate.

According to one embodiment of the present invention, an electronic apparatus with a thermal dissipating module comprises a thermal dissipating device with a thermal dissipating surface, a thermal emitting device with a thermal emitting surface, and a thermal dissipating module. Furthermore, the thermal dissipating module comprises a heat pipe with a first end and a second end, a first joint component connected to the first end and the thermal emitting surface, a second joint component connected to the second end and the thermal dissipating surface, a first thermal conductive plate, and a second thermal conductive plate.

BRIEF DESCRIPTION OF THE DRAWINGS

The present invention will become more fully understood from the detailed description given herein below illustration only, and thus is not limitative of the present invention, and wherein:

FIG. 1b is the side view of the conventional thermal dissipating module in FIG. 1a;

DETAILED DESCRIPTION OF THE INVENTION

In the following content, with reference to relative figures, we will describe an electronic apparatus and its thermal dissipating module in accord with preferred embodiments of the present invention.

Figure 1A:
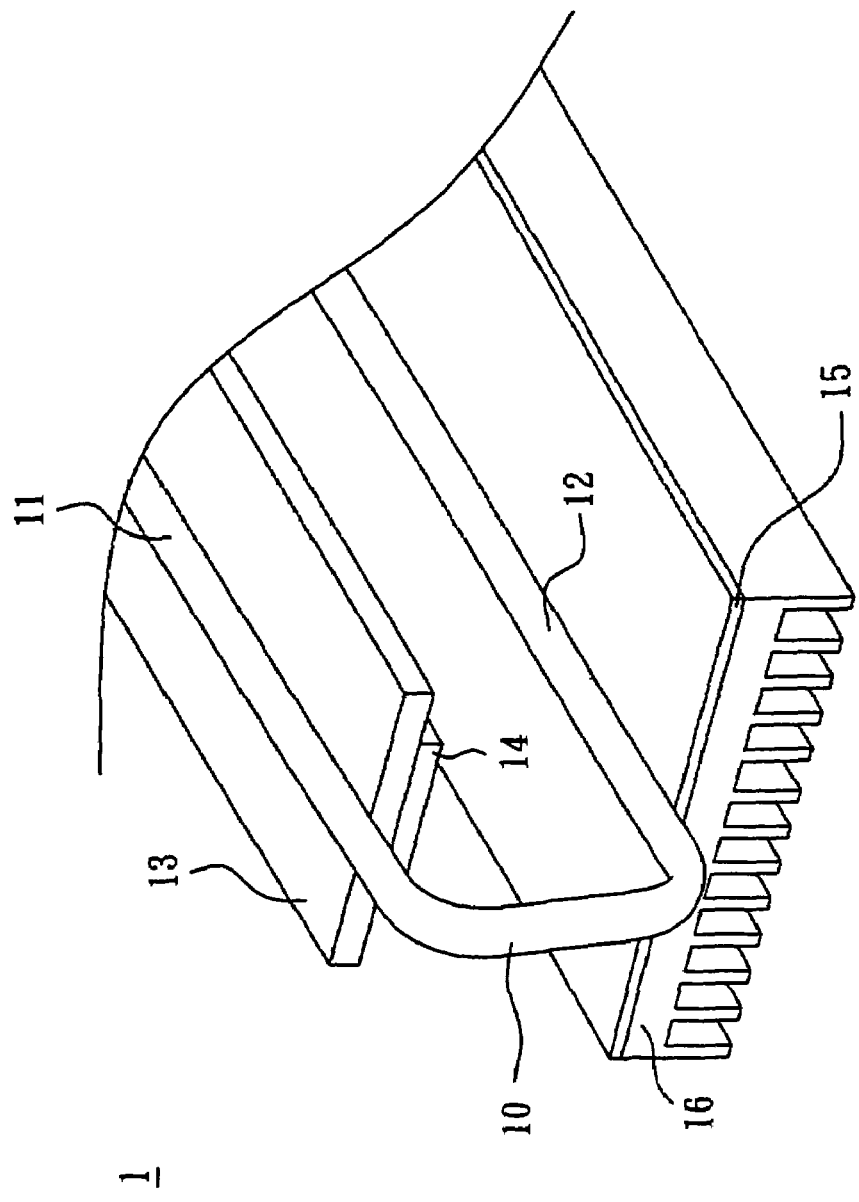
FIG. 1a is a schematic view of a conventional thermal dissipating module.
Figure 1B:
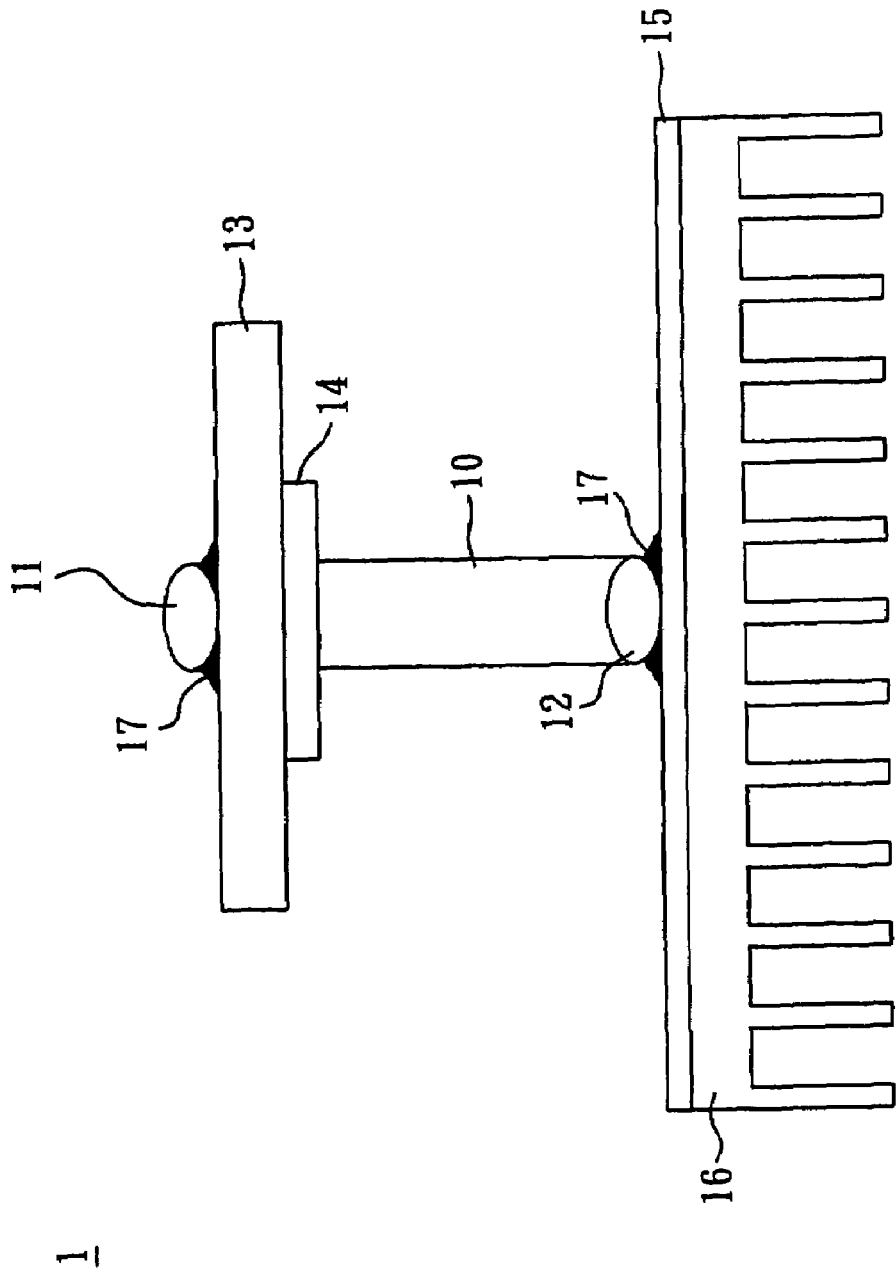
Figure 2:
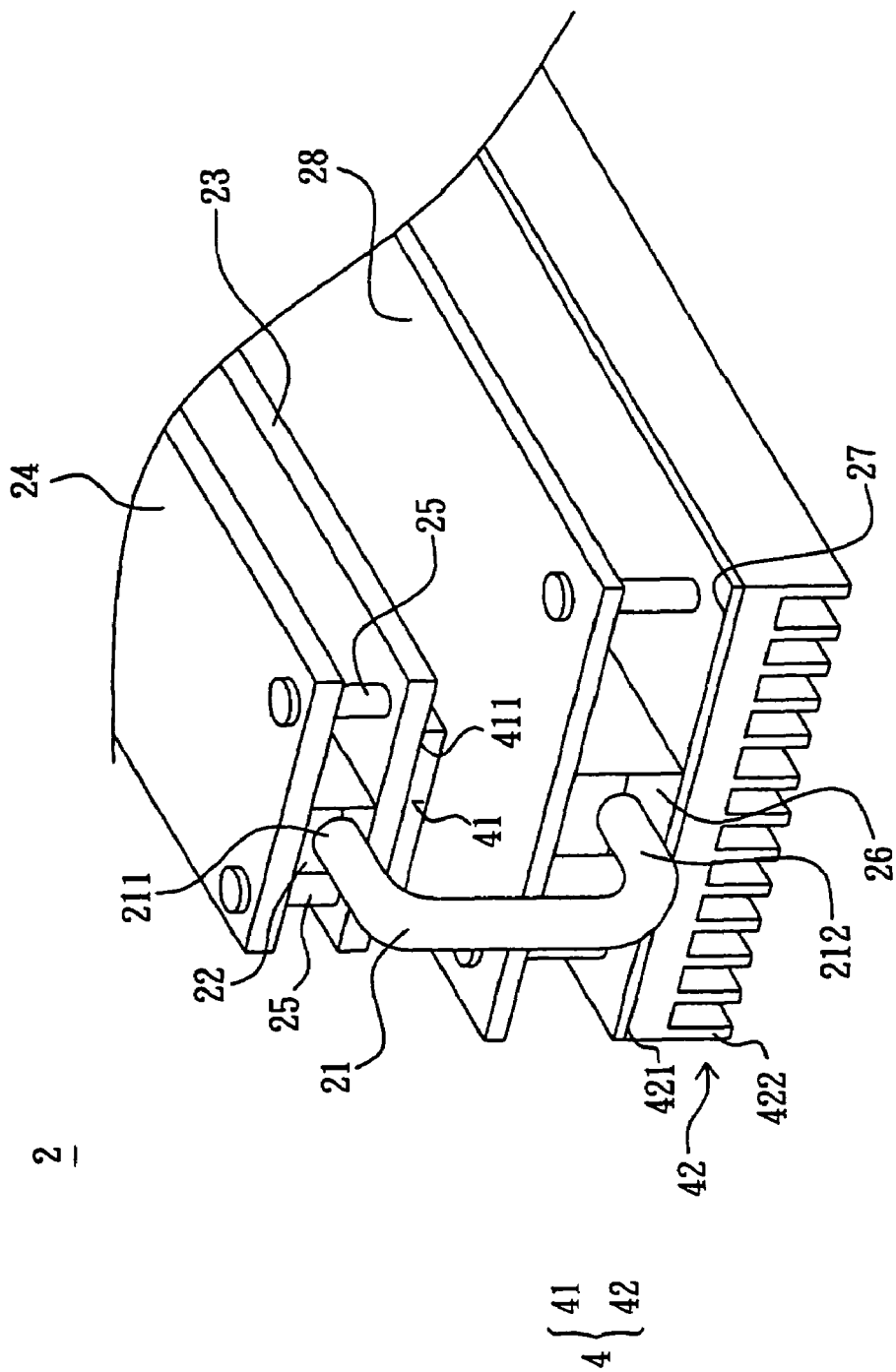
FIG. 2 is a schematic view of a thermal dissipating module according to a first embodiment of the present invention.
Figure 3:
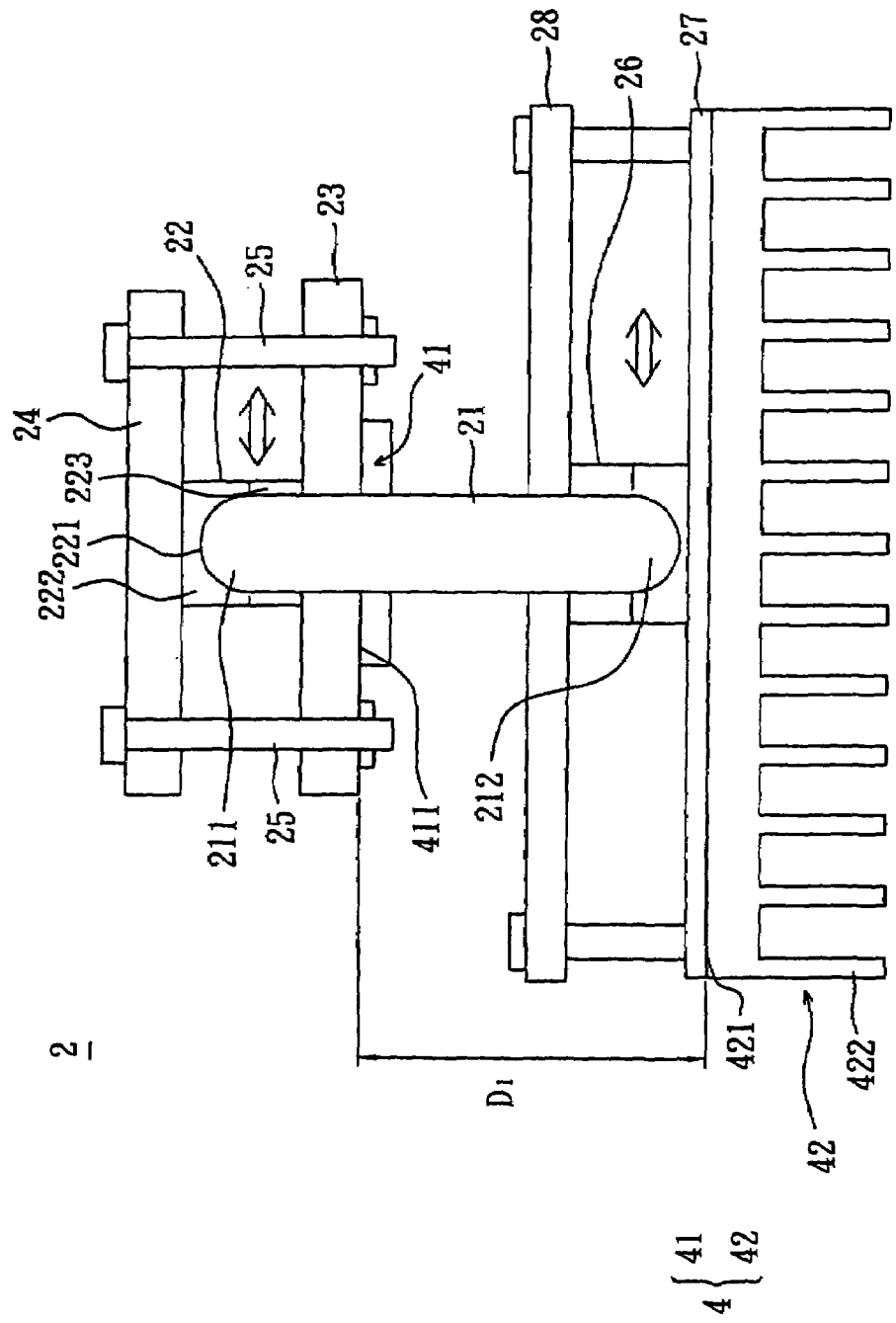
FIG. 3 is the front view of the thermal dissipating module according to the first embodiment of the present invention in FIG. 2.

In FIGS. 2 and 3, a thermal dissipating module of a first embodiment of the present invention is applied to an electronic apparatus 4. The electronic apparatus 4 has a thermal emitting device 41, a thermal dissipating device 42, and a thermal dissipating module 2. In this embodiment, the thermal emitting device 41 includes, but is not limited to, central processing unit (CPU) chips, graphic chips, display chips, or power supply. Besides, the thermal emitting device 41 has a thermal emitting surface 411, and the thermal dissipating device 42 may be a cast of the electronic apparatus 4 or a heat sink. The thermal dissipating device 42 has a thermal dissipating surface 421, and the thermal dissipating surface 421 has more than one thermal dissipating fins 422. Moreover, the thermal dissipating module 2 connects the thermal emitting device 41 and thermal dissipating device 42. The thermal dissipating module 2 comprises a heat pipe 21, a first joint component 22, and a second joint component 26.

The heat pipe 21 is an U-shaped rigid body and has two ends, a first end 211 and a second end 212. Besides, the first end 211 of the heat pipe 21 has a first axis while the second end 212 has a second axis that is parallel to the first axis. In this embodiment, the heat pipe 21 is U-shaped. However, the present invention can also use a Z-shaped heat pipe. Besides, the heat pipe 21 may have a flexible body based on the different requirements.

The first joint component 22 connects the first end 211 of the heat pipe 21. In this embodiment, the first joint component 22 has a hole 221 that is formed by combining an upper concave part 222 and a lower concave part 223 conformably. The first joint component 22 holds the first end 211 of the heat pipe 21 via the hole 221, and the first end 211 may rotate in the hole 221. In the first joint component 22 shown in FIG. 3, the upper concave part 222 and lower concave part 223 have the same conformation. But the first joint component 22 can also be formed by combining the upper concave part 222 and lower concave part 223, that have different conformations, conformably. Or the first joint component 22 can be formed directly in one-piece.

The thermal dissipating module 2 may further comprise a first thermal conductive plate 23. The first thermal conductive plate 23 is disposed between the first joint component 22 and the thermal emitting surface 411 so that the first joint component 22 may move on the first thermal conductive plate 23. Consequently, the change of the relative location of the heat pipe 21 and the first thermal conductive plate 23 may be made by moving the first end 211 of the heat pipe 21 along a first direction (an arrow shown in FIG. 3) which is perpendicular to the first axis or by rotating the first end 211 of the heat pipe 21 around the first axis.

The thermal dissipating module 2 may further comprise a third thermal conductive plate 24, and the first joint component 22 is disposed between the first thermal conductive plate 23 and third thermal conductive plate 24 so that the first joint component 22 may move on the first thermal conductive plate 23. In this embodiment, the third thermal conductive plate 24 is disposed on one side of the first thermal conductive plate 23 via more than one supports 25. Therefore, the movement of the first end 211 of the heat pipe 21 is conducted by moving the first joint component 22 between the first thermal conductive plate 23 and the third thermal conductive plate 24.

The structure of the second joint component 26 is the same as that of the first joint component 22 and connects the second end 212 of the heat pipe 21. The second end 212 of the heat pipe 21 may rotate around the second axis to change the relative location of the heat pipe 21 and second joint component 26.

The thermal dissipating module 2 may further comprise a second thermal conductive plate 27 and a fourth thermal conductive plate 28. The second thermal conductive plate 27 is disposed between the second joint component 26 and thermal dissipating surface 421 while the second joint component 26 is disposed between the second thermal conductive plate 27 and the fourth thermal conductive plate 28. Thus, the movement of the second end 212 of the heat pipe 21 is conducted by moving the second joint component 26 on the second thermal conductive plate 27. Like the first joint component 22, the second joint component 26 will move between the second thermal conductive plate 27 and fourth thermal conductive plate 28. In other words, the change of the relative location of the heat pipe 21 and the second thermal conductive plate 27 may be made by moving the second end 212 of the heat pipe 21 along a second direction (an arrow shown in FIG. 3) which is perpendicular to the second axis or by rotating the second end 212 of the heat pipe 21 around the second axis.

First, in FIG. 3 the distance between the thermal emitting surface 411 and thermal dissipating surface 421 is $D_1$, and the first end 211 and second end 212 of the heat pipe 21 respectively connect the first joint component 22 and second joint component 26 to further be connected respectively with the thermal emitting surface 411 and thermal dissipating surface 421. Thus, the heat pipe 21 may transfer the heat generated from the thermal emitting surface 411 to the thermal dissipating surface 421. The present invention may further use the thermal dissipating fins 422 to improve the thermal dissipating capability of the thermal dissipating module 2 of the present invention.

The location of the thermal emitting surface 411 and the location of the thermal dissipating surface 421 vary with different electronic apparatus designs, so that the relative location between the two ends of the heat pipe 21 should be different for the thermal dissipating requirements. By the design of this embodiment, the relative location between the first joint component 22 and the second joint component 26 will be adjustable to meet those various designs and requirements.

Figure 4:
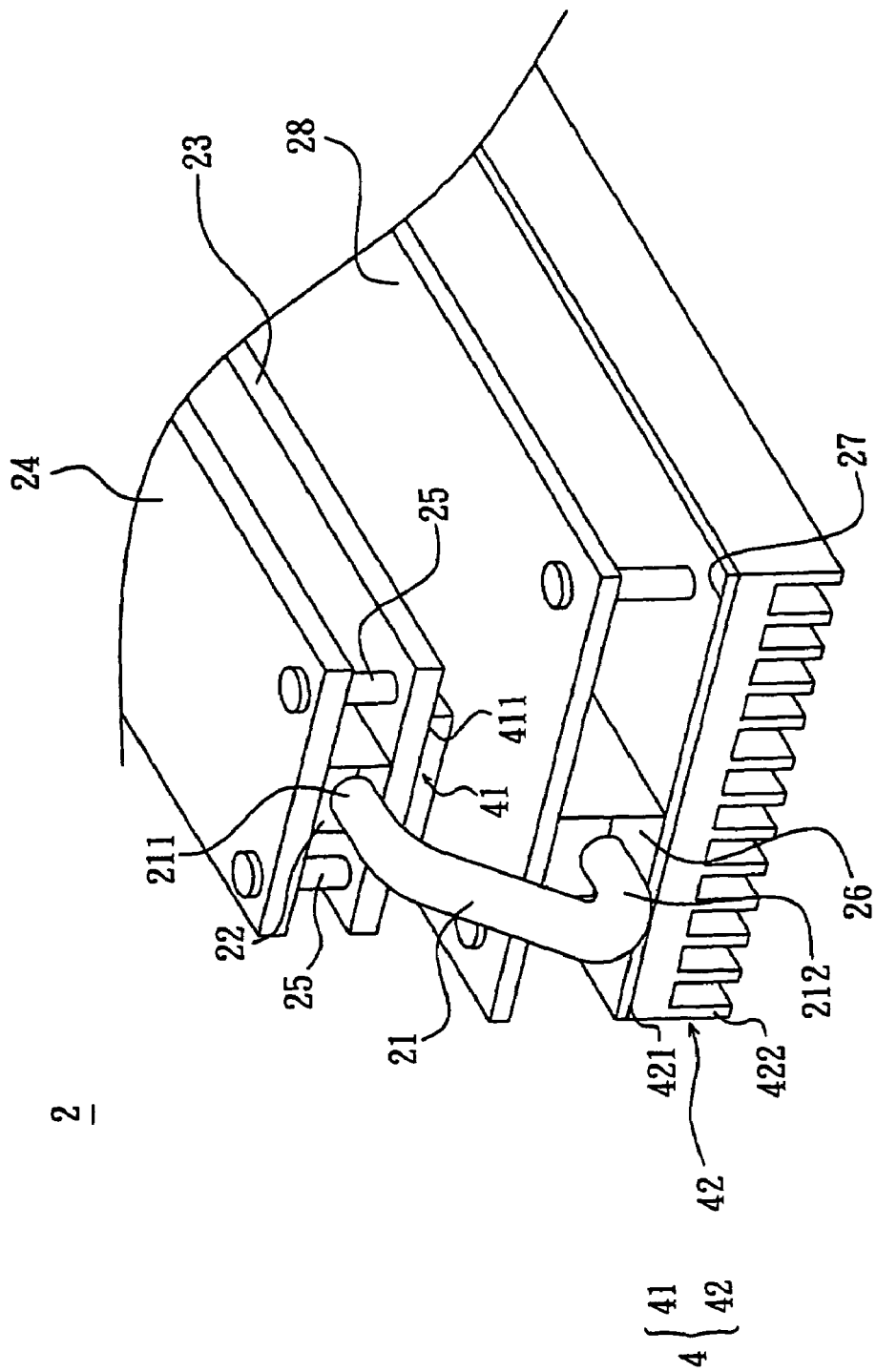
FIG. 4 is a schematic view of the adjustable heat pipe in FIG. 2.
Figure 5:
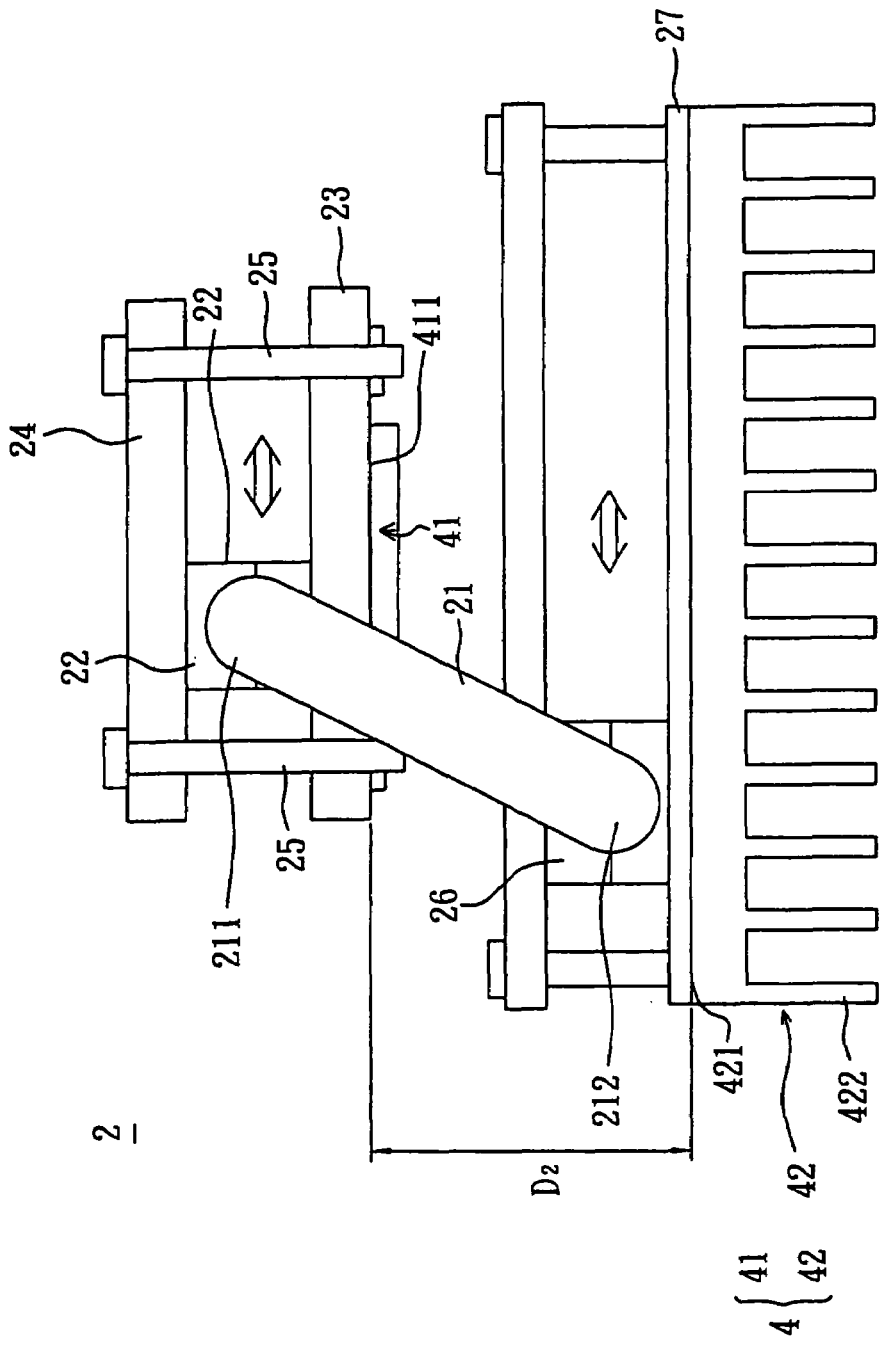
FIG. 5 is the front view of FIG. 4.

In FIGS. 4 and 5, the distance between the thermal emitting surface 411 and thermal dissipating surface 421 is $D_2$, and $D_2$ is smaller than $D_1$ in FIG. 3. In order to shorten the vertical distance between the first end 211 of the heat pipe 21 and the second end 212 of the heat pipe 21 equal to the distance $D_2$, the heat pipe 21 may rotate to a predetermined angle and adjust the relative location between the first end 211 of the heat pipe 21 and the thermal emitting surface 411. Or, the heat pipe 21 may rotate to a predetermined angle and adjust the relative location between the second end 212 of the heat pipe 21 and the thermal dissipating surface 421 to achieve the same result.

Besides, with the first joint component 22, between the first thermal conductive plate 23 and third thermal conductive plate 24, and the second joint component 26, between the second thermal conductive plate 27 and fourth thermal conductive plate 28, the heat pipe 21 may get accommodated to the inner layout of the electronic apparatus. Hence, the relative location between the first joint component 22 and second joint component 26 is adjustable through shifting the heat pipe 21 or rotating the heat pipe 21.

Figure 6:
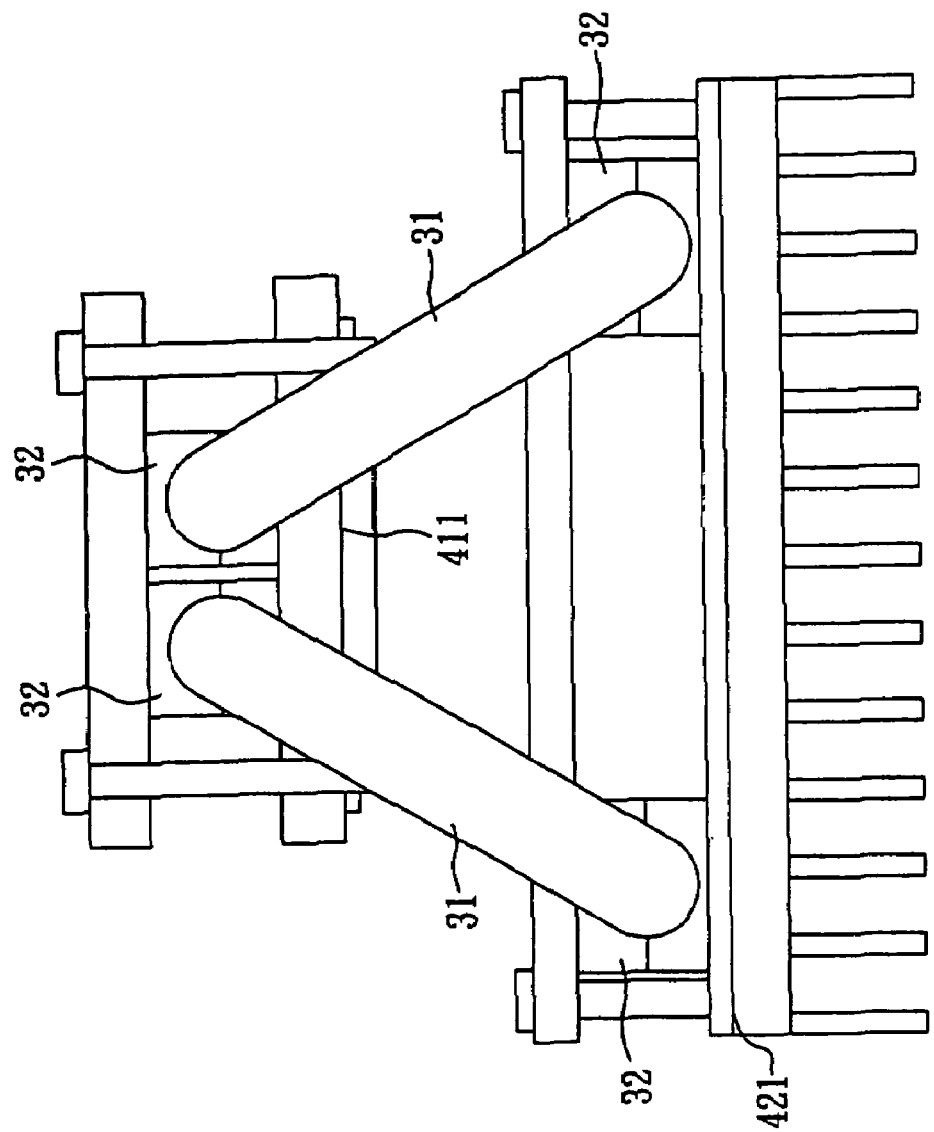
FIG. 6 is a diagram of a thermal dissipating module according to a second embodiment of the present invention.

As shown in FIG. 6, in accordance with a second embodiment of the present invention, a thermal dissipating module 3 is disposed between a thermal emitting surface 411 and a thermal dissipating surface 421 in an electronic apparatus 4. The thermal dissipating module 3 has two heat pipes 31. Each of the two heat pipe 31 has two ends disposed respectively on the thermal emitting surface 411 and thermal dissipating surface 421. The two ends of each heat pipe 31 respectively connect a joint component 32. Similarly, the purposes for adjustment are reached by moving or rotating each heat pipe 31 to change the locations of each heat pipe 31 and its two ends.

In this embodiment, the two ends of each heat pipe 31 are disposed respectively on the same thermal emitting surface 411 and thermal dissipating surface 421. However, the first ends of the heat pipes 31 may be disposed on the same thermal emitting surface while the second ends of the heat pipes 31 may be disposed separately on two different thermal dissipating surfaces. Or the first ends of the heat pipes 31 may be disposed separately on different thermal emitting surfaces while the second ends of the heat pipes 31 may be disposed on the same thermal dissipating surface. Nevertheless, each heat pipe 31 still remains the function of transferring the heat generated from the thermal emitting surface to the thermal dissipating surface, and the function is within the scope of the present invention.

To enhance the thermal dissipating capability, the number of the thermal dissipating modules or heat pipes between the thermal emitting surface 411 and thermal dissipating surface 421 may be increased in the thermal dissipating modules of the present invention for the actual requirements.

According to the above-mentioned embodiments, one who skilled in this art would modify the present invention without leaving the scope of the present invention of the movement of the joint components comparative to the thermal emitting surface 411 or the thermal dissipating surface 421. Additionally, the dimensions, structures, components, jointing methods, or interactions are exemplary, and they are not used to limit the range or scope of the inventions.

Figure 7A:
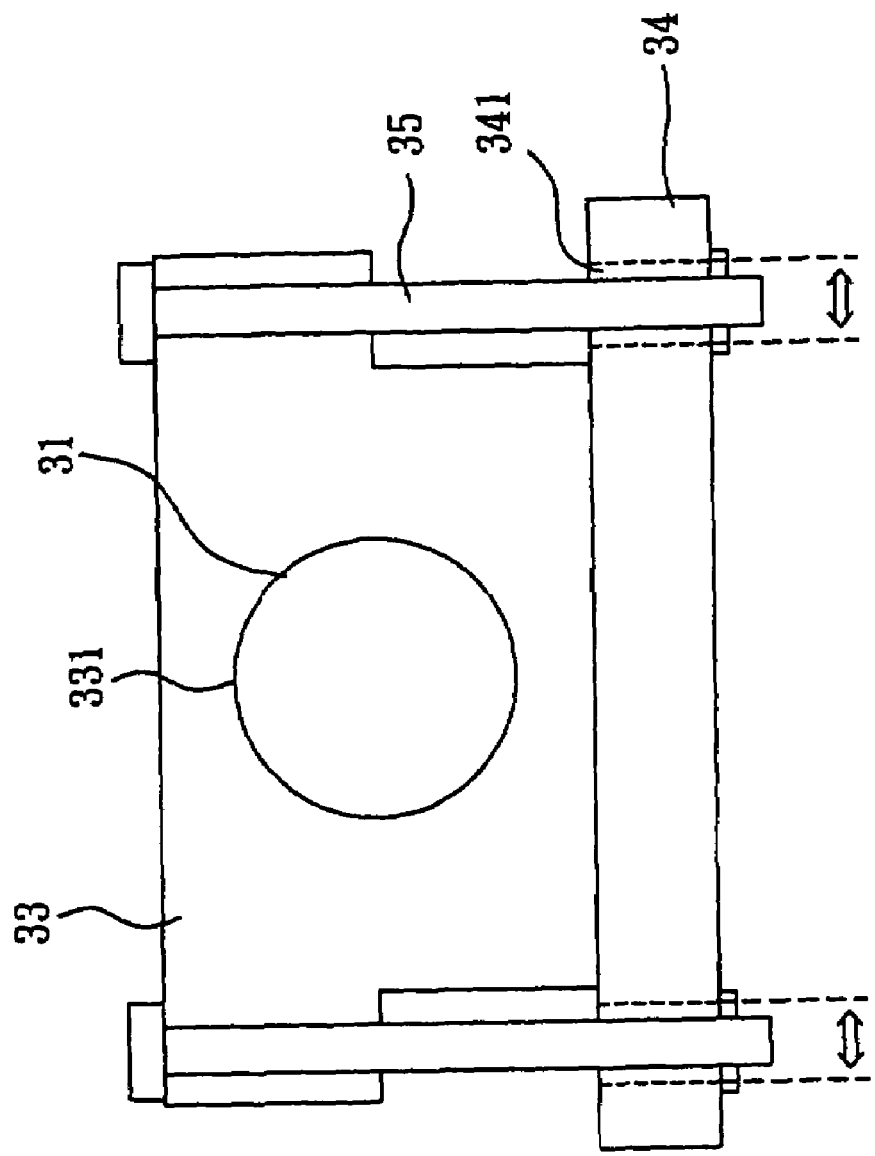
FIG. 7a is a diagram of a joint component of a thermal dissipating module of the present invention.

As shown in FIG. 7a, a joint component 33 is one-piece and has a hole 331, the heat pipe 31 is placed in the hole 331, and the joint component 33 is disposed on a thermal conductive plate 34. In this embodiment, the thermal conductive plate 34 has two apertures 341 so that two supports 35, passing through each aperture 341 for connection, may move in the tolerances of the apertures 341. Thus, the joint component 33 can move to or from the thermal conductive plate 34.

Figure 7B:
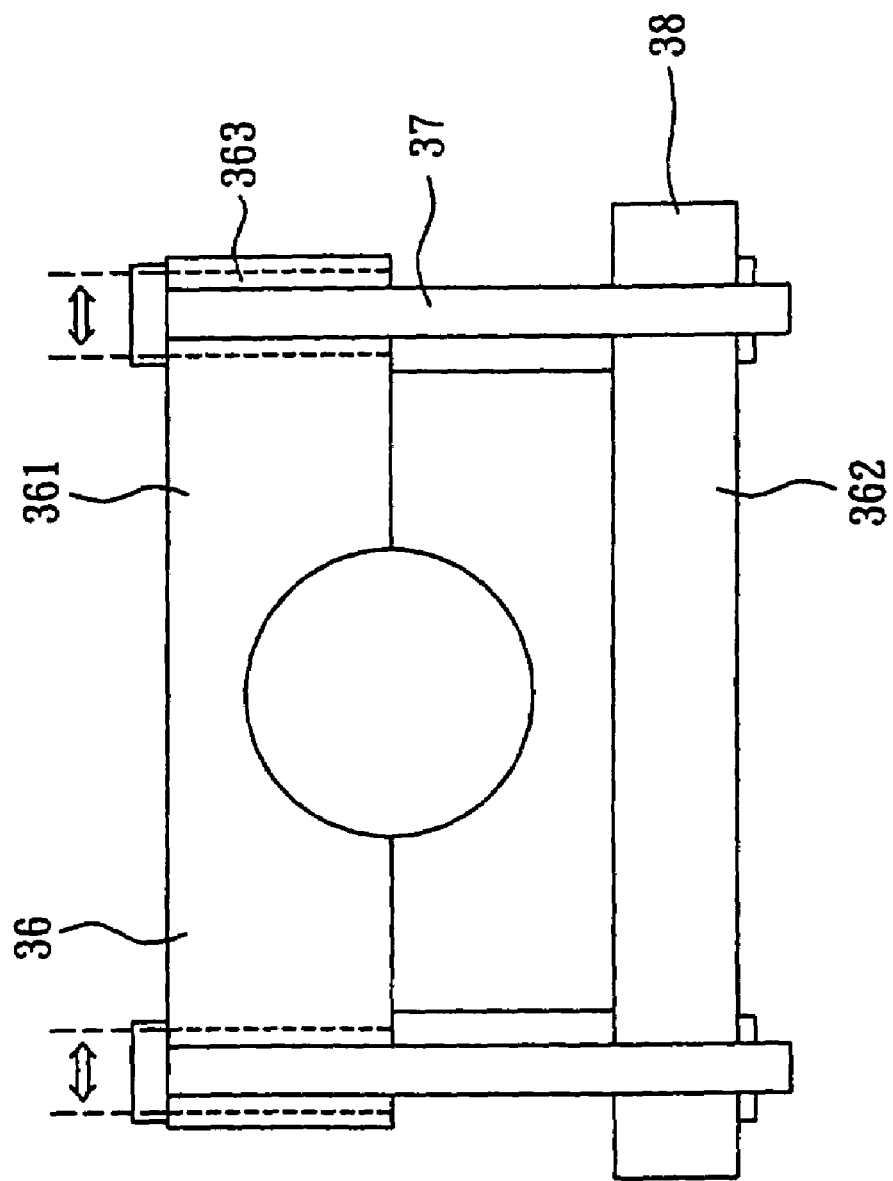
FIG. 7b is another diagram of a joint component of a thermal dissipating module of the present invention.

As shown in FIG. 7b, a joint component 36 has an upper concave part 361 and a lower concave part 362, and the upper concave part 361 has two apertures 363. The joint component 36 is combined with a thermal conductive plate 38 by two supports 37 passing through each aperture 363. Similarly, the joint component 36 position on the thermal conductive plate 38 can be changed with different layouts of the apertures 363.

Because the moving trails of the joint components 33 and 36 are related to the conformations of the apertures 341 and 363, the conformations and dimensions of the holes can be changed to let the joint components 33 and 36 move.

The apertures of the present invention may be disposed in the thermal conductive plates or joint components. On the other hand, the joint components and thermal conductive plates all may have at least one aperture to increase the adjustment range so that the joint components have larger moving range in the thermal conductive plates.

In the first and second embodiments mentioned above, the first and second joint components of the two ends of the heat pipe may respectively connect and shift on the thermal emitting surface and thermal dissipating surface. However, a thermal dissipating module of the present invention may only move on the thermal emitting surface through the first joint component or only move on the thermal dissipating surface through the second joint component.

Figure 8:
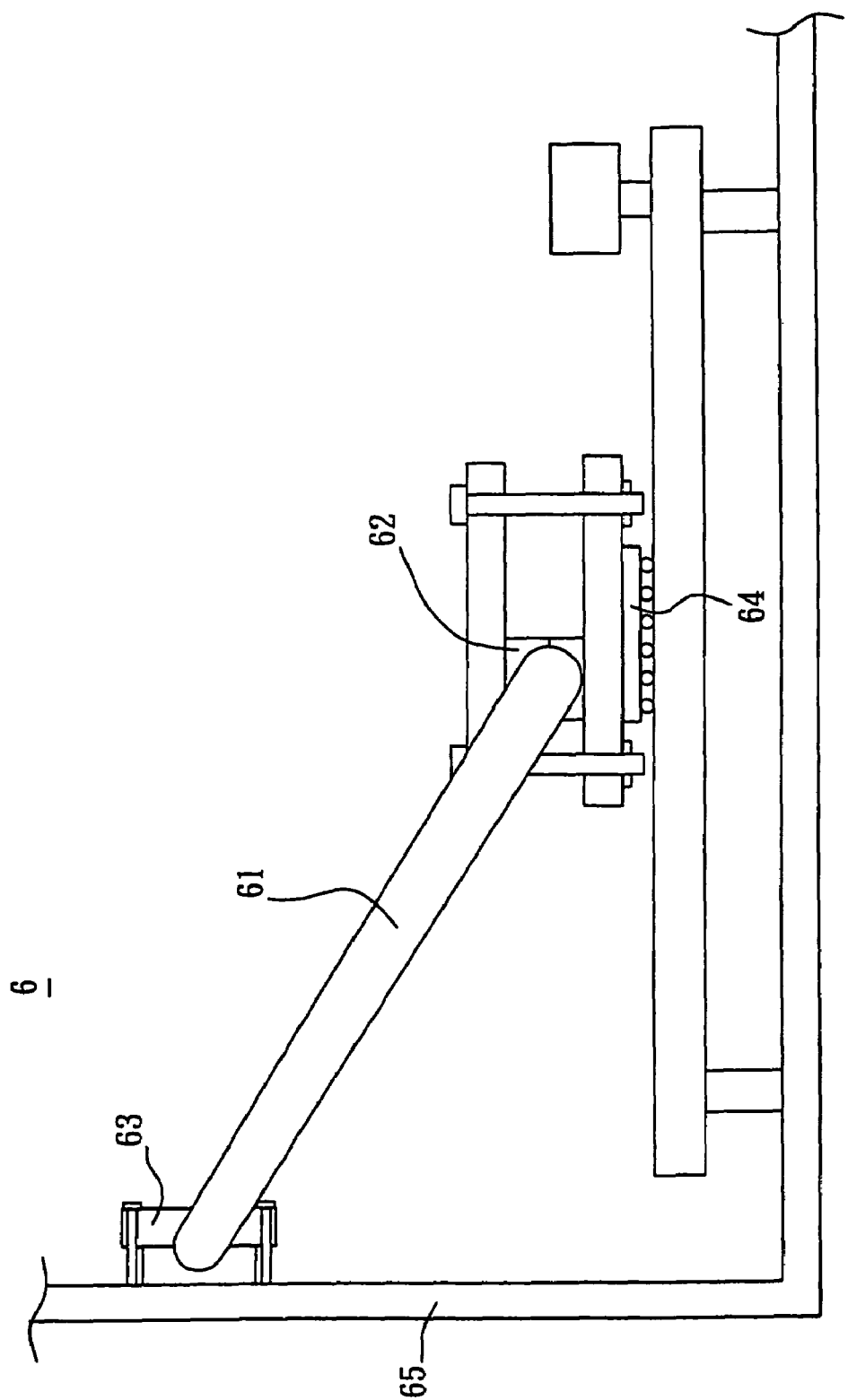
FIG. 8 is a diagram of a thermal dissipating module according to a third embodiment of the present invention.

As shown in FIG. 8, in accordance with a third embodiment of the present invention, a thermal dissipating module 6 has a heat pipe 61, a first joint component 62, and a second joint component 63. The first joint component 62 embraces one end of the heat pipe 61 and is disposed on a thermal emitting device 64. The first joint component 62 can also move in the thermal emitting device 64. The second joint component 63 embraces the other end of the heat pipe 61 and is fixed in the thermal dissipating device 65. In this embodiment, the second joint component 63 is fixed in the thermal dissipating device 65. However, to achieve the adjustable links for the thermal dissipating module 6, the angle of the heat pipe 61 can be changed by rotating one heat pipe's 61 end embraced by the second joint component 63. Besides, for the same purpose, the position of the heat pipe 61 can be changed by moving one heat pipe's 61 end embraced by in the first joint component 62.

Figure 9:
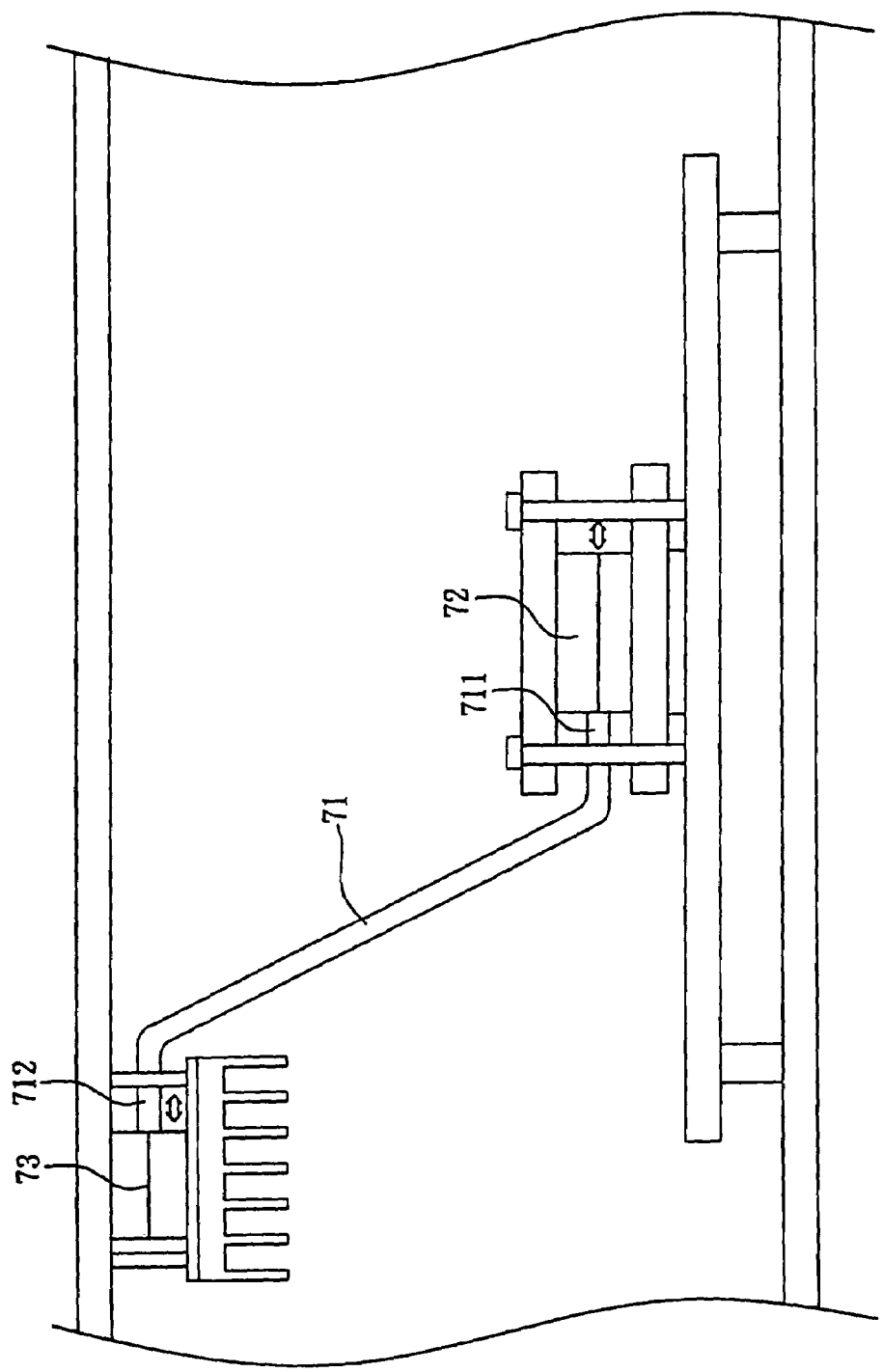
FIG. 9 is a diagram of a thermal dissipating module according to a fourth embodiment of the present invention.

In the first, second, and third embodiments mentioned above, the first joint component or the second joint component may move in the first direction perpendicular to the first axis. As shown in FIG. 9, in accordance with a fourth embodiment of the present invention, a thermal dissipating module 7 also has a heat pipe 71, a first joint component 72, and a second joint component 73. In this embodiment, the heat pipe 71 is Z-shaped, and has a first end 711 connecting to the first joint component 72 and a second end 712 connecting to the second joint component 73. Additionally, the first joint component 72 and second joint component 73 may move respectively in the direction parallel to the second axis of the second end 712 as shown in FIG. 9 with an arrow sign.

The present invention also discloses an electronic apparatus having a thermal dissipating module, and the electronic apparatus comprises a thermal dissipating device, at least one thermal emitting device, and at least one thermal dissipating module. The details are omitted since the structures and functions of the thermal dissipating device, thermal emitting device, and thermal dissipating module have already been mentioned in the above embodiments in details.

As mentioned above, in an electronic apparatus and its thermal dissipating module of the present invention, because of the structural design for the first and second joint components, the first and second joint components can move on the thermal emitting surface and thermal dissipating surface to change the relative location between the first and second joint components. Thus, the present invention can be flexibly adjusted in assigned environments to be suitable to any kinds of electronic apparatus. Moreover, compared to the conventional structure, in the present invention, no matter whether the heat pipe is rigid or flexible in its structure, the relative location between the first and second joint components can be changed to fit the requirements of actual environments.

The above-mentioned is exemplary, but not limited. The appended claims should cover any equivalent modifications and changes within the spirits and scopes of the present invention.

What is claimed is:
1. A thermal dissipating module, comprising:
a heat pipe with a first end and a second end;
a first joint component connected to the first end;
a second joint component connected to the second end;
a first thermal conductive plate, wherein the first joint component is disposed on the first thermal conductive plate;
a second thermal conductive plate, wherein the second joint component is disposed on the second thermal conductive plate; and a third thermal conductive plate, wherein the first joint component is disposed on the third thermal conductive plate, and wherein the first joint component is disposed between the first thermal conductive plate and the third thermal conductive plate.

2. The thermal dissipating module of claim 1, further comprising a fourth thermal conductive plate, wherein the second joint component is disposed on the fourth thermal conductive plate; wherein the second joint component is disposed between the second thermal conductive plate and the fourth thermal conductive plate.

3. The thermal dissipating module of claim 1, wherein the first joint component has a first hole connected to the first end.

4. The thermal dissipating module of claim 3, wherein the second joint component has a second hole connected to the second end.

5. The thermal dissipating module of claim 1, wherein the first joint component has an upper concave part and a lower concave part.

6. The thermal dissipating module of claim 5, wherein the upper concave part and the lower concave part are combined to have a hole connected to the first end.

7. The thermal dissipating module of claim 1, wherein the heat pipe is rigid.

8. The thermal dissipating module of claim 1, wherein the heat pipe is flexible.

9. The thermal dissipating module of claim 1, wherein the first end of the heat pipe has a first axis, and the second end of the heat pipe has a second axis parallel to the first axis.

10. The thermal dissipating module of claim 9, wherein the first joint component moves along a first direction perpendicular to the first axis by rotating the first end of the heat pipe.

11. The thermal dissipating module of claim 9, wherein the first joint component moves along a first direction perpendicular to the first axis by moving the first end of the heat pipe.

12. An electronic apparatus with a thermal dissipating module, at least comprising:
   a thermal dissipating device with a thermal dissipating surface;
   a thermal emitting device with a thermal emitting surface; and
   a thermal dissipating module, at least comprising:
      a heat pipe with a first end and a second end;
      a first joint component connected to the first end and the thermal emitting surface;
      a second joint component connected to the second end and the thermal dissipating surface;
      a first thermal conductive plate, wherein the first joint component is disposed on the first thermal conductive plate;
      a second thermal conductive plate, wherein the second joint component is disposed on the second thermal conductive plate; and
      a third thermal conductive plate, wherein the first joint component is disposed on the third thermal conductive plate,
      wherein the first joint component is disposed between the first thermal conductive plate and the third thermal conductive plate.

13. The electronic apparatus of claim 12, further comprising:
   a fourth thermal conductive plate, wherein the second joint component is disposed on the fourth thermal conductive plate;
   wherein the second joint component is disposed between the second thermal conductive plate and the fourth thermal conductive plate.

14. The electronic apparatus of claim 12, further comprising at least one thermal dissipating fin disposed on the thermal dissipating surface.

15. The electronic apparatus of claim 12, wherein the first joint component has a first hole connected to the first end.

16. The electronic apparatus of claim 15, wherein the second joint component has a second hole connected to the second end.

17. The electronic apparatus of claim 12, wherein the relative location between the first joint component and the second joint component is adjustable through shifting the heat pipe or rotating the heat pipe.

18. The electronic apparatus of claim 12, wherein the first end of the heat pipe has a first axis, and the second end of the heat pipe has a second axis parallel to the first axis.

19. The electronic apparatus of claim 18, wherein the first joint component moves along a first direction perpendicular to the first axis by rotating the first end of the heat pipe.

* * * * *